(12) United States Patent
Hofmeister et al.

(10) Patent No.: US 7,255,524 B2
(45) Date of Patent: Aug. 14, 2007

(54) SUBSTRATE CASSETTE MAPPER

(75) Inventors: Christopher A. Hofmeister, Hampstead, NH (US); Ulysses Gilchrist, Reading, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 57 days.

(21) Appl. No.: 10/413,102

(22) Filed: Apr. 14, 2003

(65) Prior Publication Data

US 2004/0213648 A1 Oct. 28, 2004

(51) Int. Cl.
*G01V 8/00* (2006.01)

(52) U.S. Cl. ............... 414/217.1; 250/559.4; 340/686.5

(58) Field of Classification Search ........... 414/217.1, 414/331.03, 937; 250/559.4; 340/686.5
See application file for complete search history.

(56) References Cited

U.S. PATENT DOCUMENTS

| | | | | |
|---|---|---|---|---|
| 5,364,222 A | * | 11/1994 | Akimoto et al. | 414/416.03 |
| 6,053,983 A | * | 4/2000 | Saeki et al. | 118/728 |
| 6,106,213 A | * | 8/2000 | Denker | 414/411 |
| 6,188,323 B1 | * | 2/2001 | Rosenquist et al. | 340/686.5 |
| 6,642,533 B2 | * | 11/2003 | Haraguchi et al. | 250/559.33 |
| 6,729,823 B2 | * | 5/2004 | Sakata et al. | 414/217 |
| 6,824,344 B2 | * | 11/2004 | Otaguro | 414/217.1 |
| 2004/0099826 A1 | * | 5/2004 | Igarashi et al. | 250/559.29 |
| 2004/0262548 A1 | * | 12/2004 | Komatsu | 250/559.4 |

FOREIGN PATENT DOCUMENTS

JP 2001-60615 * 6/2001

* cited by examiner

*Primary Examiner*—Thomas J Brahan
(74) *Attorney, Agent, or Firm*—Perman & Green, LLP; Richard Pickreign (57) ABSTRACT

A mechanism for mapping the contents of a cassette which is used for delivering substrates to a system for processing semiconductor and similar materials which is independent of load port or loading robot movement. The mapping mechanism includes a U-shaped probe having a photo emitter/receptor mounted on opposing surfaces of its legs. The U-shaped probe is mounted on a carriage for rotation about its longitudinal axis. The carriage is, in turn, mounted on a track for movement over the height of the cassette. The mapping mechanism is mounted on the loading port frame of the processing system adjacent to the load port and is moved into and out of it sensing position by interaction with a cam.

29 Claims, 6 Drawing Sheets

SUBSTRATE CASSETTE MAPPER

BACKGROUND OF THE INVENTION

1. Field of the Invention

The present invention relates to substrate cassettes which provide a supply of substrates to a processing system and more particularly to a mechanism for sensing the presence or absence of substrates in the slots of the cassettes

2. Brief Description of Related Developments

In semiconductor and similar materials processing it is well known to mount multiple substrates in slots constructed in an enclosure, such as a cassette. The cassette is mounted in relation to the loading door of a processing system for access by a loading robot. The loading robot extracts a substrate from the cassettes and delivers the substrate to a processing chamber. In order to expedite the loading process it is advantageous to identify the slots of the cassette that contain substrates. This mapping process is needed to avoid unnecessary movement of the loading robot.

Cassette mapping has been accomplished in the past by several different methods, such as reflective and through beam sensing. These sensors may be fixed or moveable. They are sometimes mounted on the loading port door or on the loading robot. Fixed reflective sensors must rely on obtaining an accurate reflection and require an array of emitter/receptor pairs. Such systems have been found to be expensive and result in false readings which hinder their reliability. In another solution of the prior art, sensors have been mounted on the load port door and rely on controlled door movement to insure proper scanning of the cassette bay. In this instance door movement has to be controlled to allow access by the sensors to the cassette bay without interfering with the loading process. This has been found to be a relatively slow.

It is a purpose of this invention to construct a mapping system which provides an efficient mapping of a cassette independent of load port door movement or loading robot movement. It is a further purpose of this invention to use through beam sensors mounted on the load port frame.

SUMMARY OF THE INVENTION

The present invention is directed to a system for mapping the slots of a cassette to determine the presence of substrates for processing. In the system of this invention, a mapping mechanism is mounted for controlled movement on the frame of the load port. The mapping mechanism includes a sensor assembly, which comprises a lever arm having a pair of parallel projections extending transverse to its longitudinal axis to form a generally U-shaped probe. The parallel projections have opposing surfaces on which are mounted a sensor beam emitter and receptor pair. The sensor is mounted to generate a beam that extends across the opening formed by the distal ends of the projections, i.e., the opening of the U-shaped probe. The lever and arm assembly together form a sensing plane.

The sensor assembly is mounted on a carriage which is mounted for movement up and down the substrate stack within the cassette. To accomplish this, the carriage is mounted on a rail and is driven along the rail by appropriate motors, such as stepping motors. To allow the sensor assembly to engage the cassette stack and to avoid interference with the loading process, the sensor assembly is mounted on the carriage for rotation about the longitudinal axis of the lever arm. Rotation of the lever arm is controlled by the interaction of a bias spring, which tends to rotate the lever arm to a position in which the sensing plane of the sensor assembly is parallel to the plane of the substrates in the cassette stack. In addition a cam track is mounted adjacent the sensor movement rail. A cam follower is fixed to the lever arm and extends into engagement with the cam track. The cam track is constructed to rotate the lever arm into its retracted position at one end of the sensor assembly movement.

In this manner a sensor assembly is provided which is independent of load port door movement or the movement of the loading robot. It effectively flips into and out of sensing engagement with the substrate stack within the cassette.

BRIEF DESCRIPTION OF THE DRAWINGS

The invention is described in more detail below with reference to the attached drawing in which:

FIG. 4 is a side view of the sensor assembly shown in FIG. 3a; and

DETAILED DESCRIPTION OF THE PREFERRED EMBODIMENT

Figure 1:
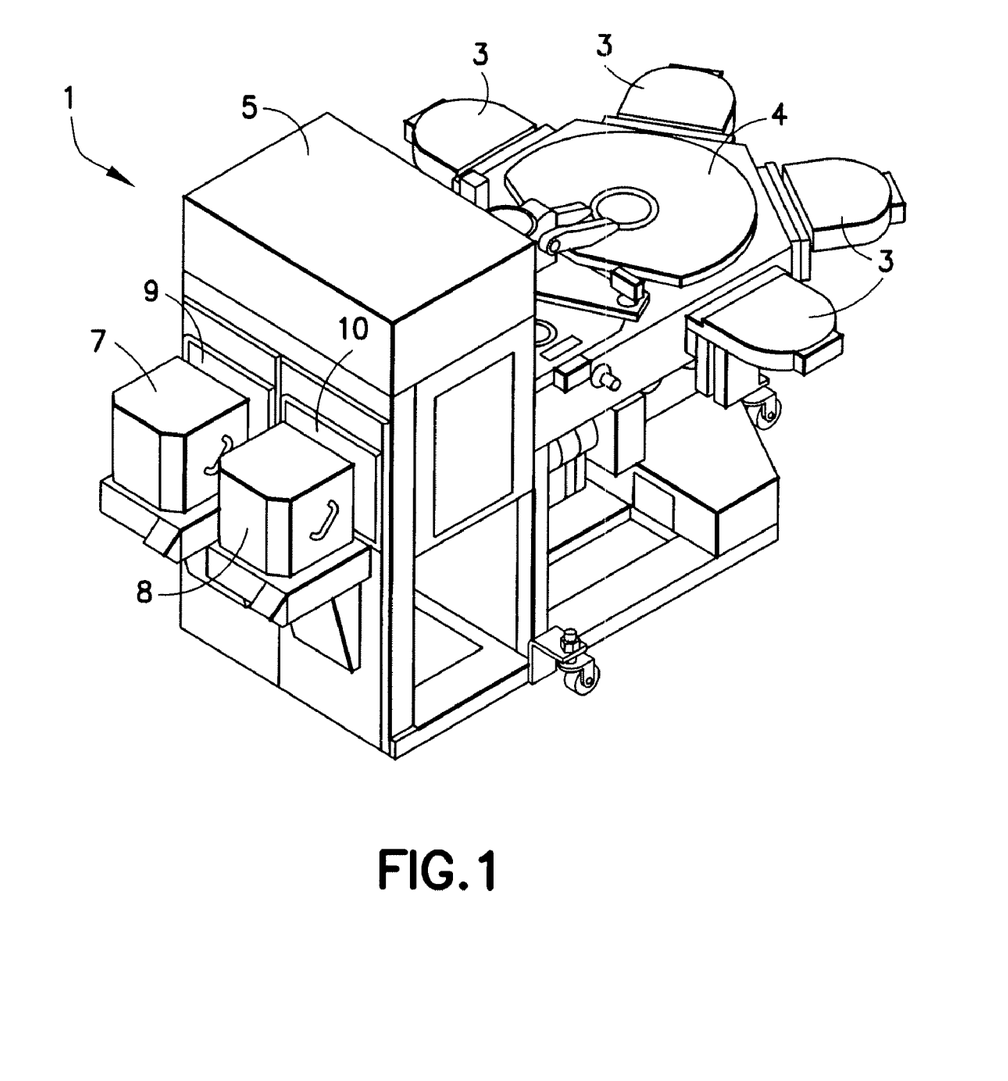
FIG. 1 is a perspective view of a substrate processing system.
Figure 2:
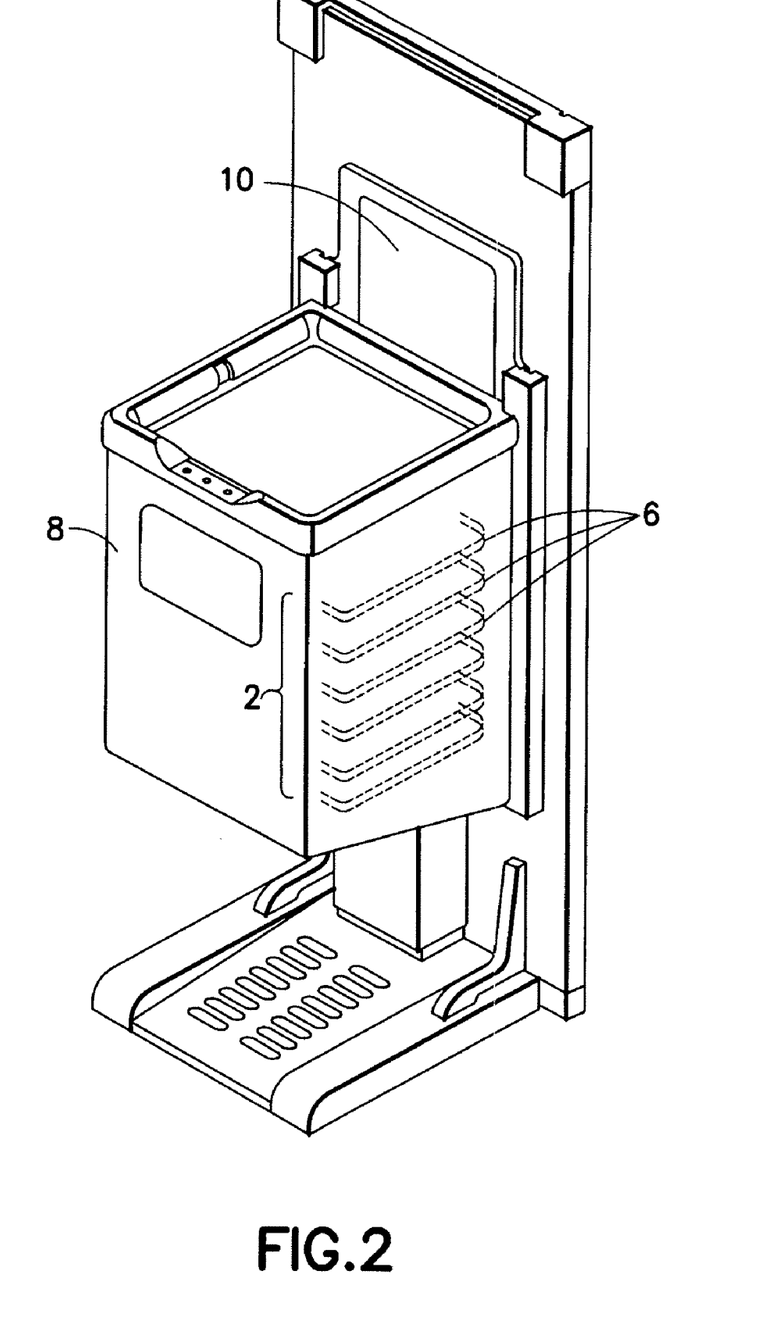
FIG. 2 is a perspective view of a load port of a substrate processing system.
Figure 3A:
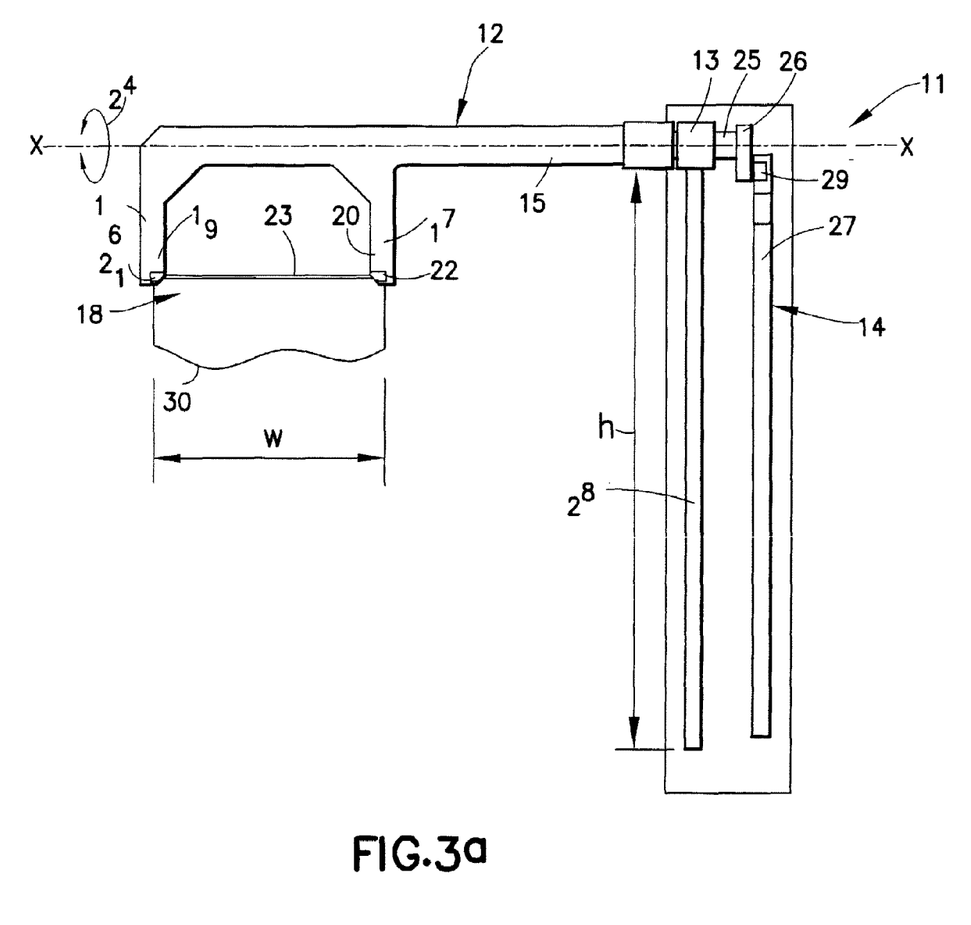
FIG. 3a is a front view of the sensor assembly of this invention.
Figure 3B:
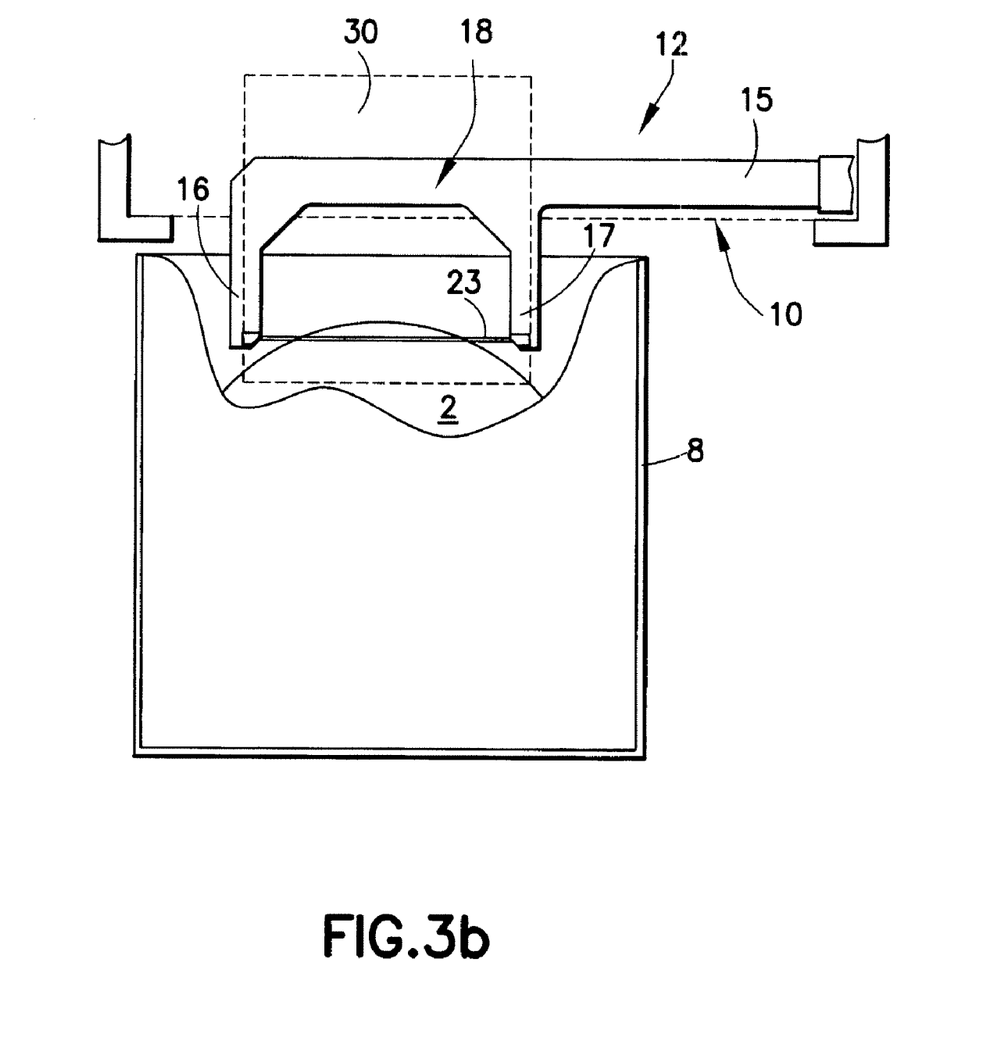
FIG. 3b is a top view of the sensor assembly in the mapping position, extended into substate cassette.
Figure 4:
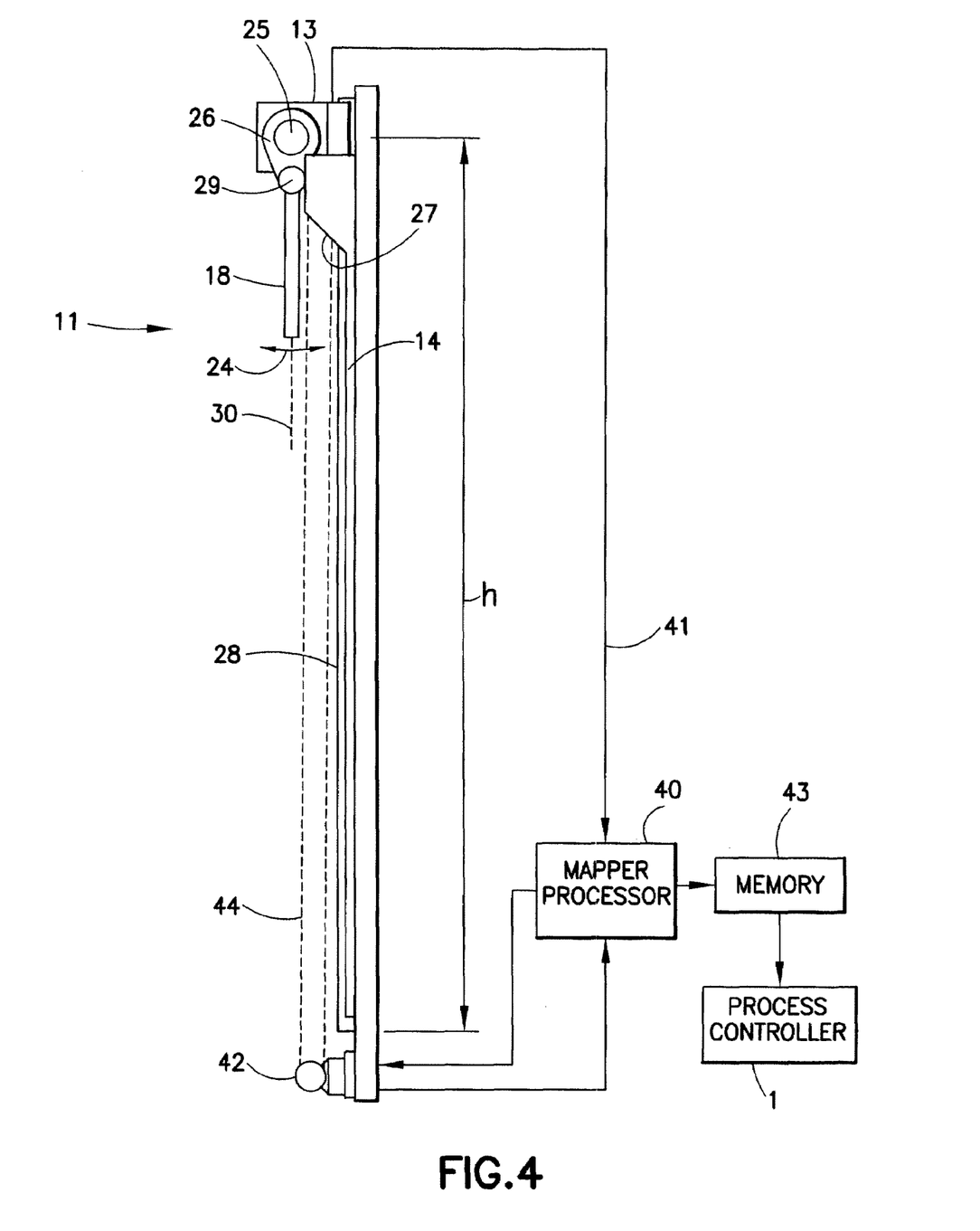
Figure 5:
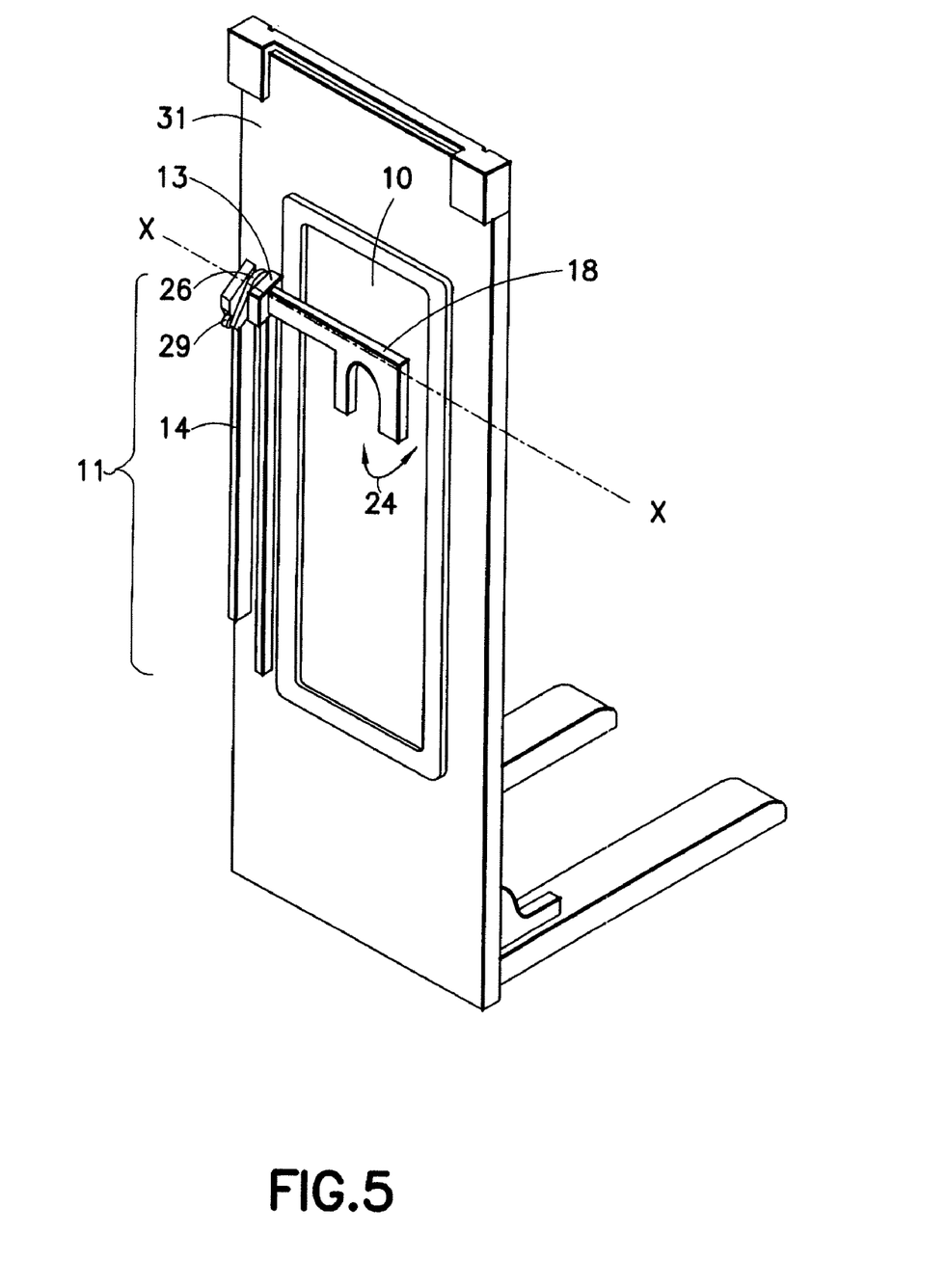
FIG. 5 is a view of the interior side of a load port with the sensor assembly installed.

A system 1 for processing substrates 2 is shown in FIG. 1 and is constructed with a series of processing chambers 3 communicating with a vacuum chamber 4. A loading module 5 is connected to the vacuum chamber 4. Substrates 2 are stacked for processing in cassettes 7 and 8, as shown in FIG. 2. Cassettes 7 and 8 are connected to the loading module through loading ports 9 and 10. The substrates 2 are moved from a slot in a cassette into loading module 5 by a loading robot (not shown) which forms part of loading module 5. The substrates 2 are then moved into vacuum chamber 4 either by the loading robot or a processing robot (not shown) positioned in vacuum chamber 4. Processing is performed when the substrates are placed in one of the processing chamber's 3. There are many different configurations of substrate processing systems which may utilize a cassette based delivery system. The system shown in FIGS. 1 and 2 are for illustration only and do not constitute a significant part of this invention. System 1 will be used as a context for further description of the invention. In addition the system is not limited for use with any particular size substrate. In FIG. 2, cassette 8 is shown mounted to load port 10. Stacked slots 6 of cassette 8 are constructed to receive and store a series of substrates 2. In order to provide data with respect to the location of slots which contain substrates, a system 11 for mapping the slots 6 of cassette 8 is provided, as shown in FIGS. 3 through 5. System 11 includes sensor assembly 12, mounting carriage 13 and movement control tracks 14 and 28. System 11 is secured to the loading port frame 31 adjacent to the loading port, as shown in FIG. 5. As shown in FIG. 5, preferably system 11 is mounted inside the load module 5 for operation through the load port.

Sensor assembly 12 is constructed having a lever arm 15 and a pair of parallel projections 16 and 17 extending transverse to the longitudinal axis x-x of lever arm 15 to form a generally U-shaped probe 18. The lever arm 15 extends longitudinally across an edge of a load port opening through which substrates in the cassette are accessed. The parallel projections 16 and 17 have opposing surfaces 19 and 20 on which are mounted a sensor beam transmitter and receptor pair 21 and 22 respectively. The sensor pair 21/22 is mounted with its optical beam 23 extending across the opening formed by the distal ends of the projections 16 and 17, i.e., the opening of the U-shaped probe 18. U-shaped probe 18 is formed with a gap having a width w that is determined by the range in size of the substrates that are intended to be processed. The lever arm 15 and sensor probe 18 assembly, together, form a sensing plane 30 as shown in FIG. 3b, extending transverse to axis x-x of lever arm 15.

The sensor assembly 12 is mounted on carriage 13 for rotation about its axis x-x, as shown by arrow 24 in FIG. 3a. An extension bar 25 projects through carriage 13 from lever arm 15. A cam arm 26 is attached to the distal end of bar 25 and extends transverse to the longitudinal axis x-x. A cam follower 29 is mounted on the arm 26 for engagement with the cam surface 27 of cam track 14. Carriage 13 contains a bias spring (not shown) which exerts a force on the lever arm 15 tending to rotate the sensor plane into a parallel relationship with the plane of the stacked substrates 2. Carriage 13 is mounted for movement on rail 28 and is driven along the rail by appropriate motors 42, such as stepping motors. The drive motors may be operatively connected to the carriage 13 by an appropriate transmission mechanism such as a belt 44 or rack and pinion arrangement. Track 28 is designed to provide a range of movement h, as shown in FIGS. 3a and 4. The drive signals for motor 42 provides a convenient indication of the position of the carriage 13 on rail 28. This is correlated with probe signals to provide a substrate position reading which can be saved in memory for use in process loading.

A cam track 14 is provided adjacent track 28 for engagement with cam follower 29. Cam surface 27 of track 14 is shaped to provide a force on cam lever 26 which tends to rotate the probe 18 against the force of its bias spring. At one extremity of movement, i.e. the upper end as shown in FIG. 3a, the sensor plane 30 is allowed to rotate 90° into a position, as shown in FIG. 4, in which it is parallel to the load port door and out of the way of load robot movement.

In operation sensor probe 18 is lowered, by movement of carriage 13 on rail 28, to a position on cam surface 27 which allows the lever arm 15 to twist about its axis approximately 90° towards the stack of substrates 2 in cassette 8 (see FIG. 3b). At this point, sensing plane 30 swings into a parallel relation to the substrates 2. When mounted in the inside of loading module 5, sensor probe 18 projects through the load port 10 into alignment with the stacked substrates 2. This is of course accomplished after the load port is opened. Carriage 13, with sensor probe 18, is lowered further until a substrate 2 interrupts beam 23, as shown in FIG. 3b.

The interruption of beam 23 generates a signal in a well known manner for transmission to microprocessor 40, as shown in FIG. 4. Microprocessor 40 may be a dedicated ASIC which is operatively connected to process control system 50 for processing system 1. The position of sensor probe 18, within its range of movement h, on rail 28 is monitored by microprocessor 40. The interrupt signal is correlated to a carriage position reading to establish the location of a substrate 2 in cassette 8 which is ready for delivery into the processing system 1. The position of carriage 13 may be monitored in several ways for example by registering drive signals to motor 42 or by actually sensing position along rail 28. A simple look up table may be established based on the known physical relationship of the components to provide a correlation with a substrate slot.

All of the slots 6 of cassette 8 are scanned and a map of its contents is stored in the control system of the processing system. When the scan is complete the control system initiates movement of the probe 18. The probe 18 is moved back to its start position on travel rail 28 in which engagement of the cam surface 27 by follower 29 will twist lever arm 25 to its stored position. The delivery of substrates to the process system 1 proceeds in an efficient manner. Mapping is accomplished by system 11 independent of the movement of either load port door 10 or a loading robot (not shown).

As shown schematically in FIG. 4, the sensor interrupt signal is fed to mapper processor 40 through link 41. Mapper processor 40 generates signals to activate drive motor 42 in response to a mapping command from process controller 50. The drive signals are monitored to maintain a continuous position reading of carriage 13 on rail 28. When an interrupt signal is received, the position is registered and stored in memory 43 for use by controller 50 in the substrate loading process. It should be noted that the implementation of the components of the mapping function may be accomplished in many different ways and could be incorporated into process controller 50. It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A mechanism for mapping slots in an enclosure, said enclosure constructed to present substrates to a substrate processing system, to enable delivery of said substrates from said enclosure to a load port of a loading module which is part of said substrate processing system, said mapping mechanism comprising:

a probe supported on an elongated lever arm wherein said probe is constructed having a sensing plane extending transverse to a longitudinal axis of said lever arm;

a through beam sensor mounted on said probe and defining said sensing plane, to generate a signal when said beam is interrupted;

a mounting mechanism, positioned adjacent to a load port of said processing system, on which said probe is mounted for both rotational movement about said longitudinal axis and for linear movement to traverse the enclosure, the linear movement being transverse to the longitudinal axis and the lever arm being engaged to the mounting mechanism and extending longitudinally across an edge of a load port opening through which the substrates in the enclosure are accessed; and a control mechanism for rotating said sensing plane of said probe about said longitudinal axis from a stored position to a sensing position, wherein, in said sensing position, said sensing plane extends into said enclosure and said substrates present in said enclosure will interrupt said beam as the probe is moved past said substrate.

2. A mechanism for mapping slots in an enclosure, said enclosure constructed to present substrates to a substrate processing system, to enable delivery of said substrates from said enclosure to a load port of a loading module which is part of said substrate processing system, said mapping mechanism, according to claim 1 wherein said mounting mechanism comprises a travel rail mounted adjacent said load port.

3. A mechanism for mapping slots in an enclosure, said enclosure constructed to present substrates to a substrate processing system, to enable delivery of said substrates from said enclosure to a load port of a loading module which is part of said substrate processing system, said mapping mechanism, as described in claim 2, wherein said control mechanism comprises:
- a cam track mounted adjacent to said travel rail and parallel thereto, said cam track having a contoured cam surface for engagement with a cam follower;
- a cam follower mounted to an arm fixed to said probe lever arm and extending transverse to the longitudinal axis of said lever arm, said cam follower engaging said cam surface for movement therewith, as said probe moves on said travel rail; and
- wherein said rotating movement is biased so that said cam follower is maintained in engagement with said cam surface and said cam surface is contoured to move said sensing plane from said stored position to said sensing position.

4. A mechanism for mapping slots in an enclosure, said enclosure constructed to present substrates to a substrate processing system, to enable delivery of said substrates from said enclosure to a load port of a loading module which is part of said substrate processing system, said mapping mechanism, as described in claim 3, wherein, in said stored position said sensing plane is parallel to said load port and in said sensing position said sensing plane is rotated to be parallel with a plane of said substrate slots.

5. A mechanism for mapping slots in an enclosure, said enclosure constructed to present substrates to a substrate processing system, to enable delivery of said substrates from said enclosure to a load port of a loading module which is part of said substrate processing system, said mapping mechanism, as described in claim 1, further comprising a microprocessor which is part of a control system for said substrate processing system, said microprocessor connected to receive the signal from said sensor and process said signal for use in delivering said substrates to said processing system.

6. A mechanism for mapping slots in an enclosure, said enclosure constructed to present substrates to a substrate processing system, to enable delivery of said substrates from said enclosure to a load port of a loading module which is part of said substrate processing system, said mapping mechanism, according to claim 5, wherein said microprocessor monitors the position of the probe on a travel rail and correlates the receipt of an interrupt signal to said position on said travel rail to establish a substrate location, and further wherein said substrate location is stored for use in said substrate processing system.

7. A mechanism for mapping slots in an enclosure, said enclosure constructed to present substrates to a substrate processing system, to enable delivery of said substrates from said enclosure to a load port of a loading module which is part of said substrate processing system, said mapping mechanism, according to claim 2 further comprising a carriage mounted for movement on said travel rail, said lever arm attached to said carriage for movement therewith and for rotation thereon about said longitudinal axis of said lever arm.

8. A mechanism for mapping the slots in an enclosure, said enclosure constructed to present substrates to a substrate processing system, to enable delivery of said substrates from said enclosure to a load port of a loading module which is part of said processing system, said mapping mechanism, as described in claim 7, wherein said carriage is driven on said rail by motors through a transmission, said motors moving in response to signals from a control system of said substrate processing system.

9. A mechanism for mapping slots in an enclosure, said enclosure constructed to present substrates to a substrate processing system, to enable delivery of said substrates from said enclosure to a load port of a loading module which is part of said substrate processing system, said mapping mechanism, as described in claim 1 wherein the sensing probe is substantially U-shaped.

10. A mechanism for mapping slots in an enclosure, said enclosure constructed to present substrates to a substrate processing system, to enable delivery of said substrates from said enclosure to a load port of a loading module which is part of said substrate processing system, said mapping mechanism, as described in claim 1, wherein said probe is substantially U-shaped and said sensor comprises an emitter and a receptor mounted on opposing surfaces of said U-shaped probe to emit and receive an optical beam, said sensor connected to generate a signal when said beam is interrupted.

11. A mechanism for mapping slots in an enclosure, said enclosure constructed to present substrates to a substrate processing system, to enable delivery of said substrates from said enclosure to a load port of a loading module which is part of said substrate processing system, said mapping mechanism, as described in claim 1, wherein the enclosure is a substrate cassette adapted for engagement with said load module.

12. A mechanism for mapping slots in an enclosure, said enclosure constructed to present substrates to a substrate processing system, to enable delivery of said substrates from said enclosure to a load port of a loading module which is part of said substrate processing system, said mapping mechanism, as described in claim 1, wherein said mapping mechanism is mounted inside said load module and said lever arm is attached in a position in which said sensing plane extends through said load port into said enclosure.

13. A mechanism for mapping slots in an enclosure, said enclosure constructed to present substrates to a substrate processing system, to enable delivery of said substrates from said enclosure to a load port of a loading module which is part of said substrate processing system, said mapping mechanism, as described in claim 1, wherein said mapping mechanism is mounted to a frame of said load port.

14. Apparatus for delivering substrates to a load module of a substrate processing system through a load port thereof, said load port having a load port opening through which substrates are delivered to the substrate processing system, the load port opening having an opening border the apparatus comprising:
- an enclosure having a series of slots for retaining substrates for delivery, said enclosure positioned in front of said load port during delivery of said substrates;
- a mapping mechanism, mounted on said opening border, for mapping said slots to determine the presence of substrates in said slots, said mapping mechanism mounted independently of all load port doors and all loading robots, said apparatus further comprises:
- a probe supported on an elongated lever arm wherein said probe is constructed having a sensing plane extending transverse to a longitudinal axis of said lever arm;
- a through beam sensor mounted in said sensing plane to generate a signal when said beam is interrupted;

a travel rail mounted on said opening border adjacent to said load port opening of said processing system;

a carriage mounted for movement on said travel rail, said lever arm attached to said carriage for movement therewith on said rail and for rotation about said longitudinal axis thereof;

a drive system for moving said carriage on said travel rail to traverse the cassette; and a control mechanism for rotating said sensing plane of said probe from a stored position to a sensing position, wherein, in said sensing position, substrates present in said enclosure will interrupt said beam as the probe is moved passed said substrate.

15. Apparatus for delivering substrates to a substrate processing system through a load port thereof, as described in claim 14, wherein said control mechanism comprises:

a cam track mounted on said load port frame adjacent to said travel rail and parallel thereto, said cam track having a contoured cam surface for engagement with a cam follower;

a cam follower mounted to an arm fixed to said probe lever arm and extending transverse to the longitudinal axis of said lever arm, said cam follower engaging said cam surface for movement therewith, as said carriage moves on said travel rail; and wherein said rotating movement is biased so that said cam follower is maintained in engagement with said cam surface and said cam surface is contoured to move said sensing plane from said stored position to said sensing position.

16. Apparatus for delivering substrates to a substrate processing system through a load port thereof, as described in claim 14, wherein, in said stored position said sensing plane is parallel to said load port and in said sensing position said sensing plane is rotated to be parallel with a plane of said substrate slot.

17. Apparatus for delivering substrates to a substrate processing system through a load port thereof, as described in claim 14, wherein said mapping mechanism is mounted inside said load module and said lever arm is attached in a position in which said sensing plane extends through said load port into said enclosure.

18. Apparatus for delivering substrates to a substrate processing system through a load port thereof, as described in claim 14, further comprising a microprocessor which is part of a control system for said substrate processing system, said microprocessor connected to receive the signal from said sensor and process said signal for use in delivering said substrates to said processing system.

19. Apparatus for delivering substrates to a substrate processing system through a load port thereof, as described in claim 14, wherein said carriage is driven on said rail by motors through a transmission in response to signals for a control system of said substrate processing system.

20. Apparatus for delivering substrates to a substrate processing system through a load port thereof, as described in claim 14, wherein said probe is substantially U-shaped and said sensor comprises an emitter and a receptor mounted on opposing surfaces of said U-shaped probe to emit and receive an optical beam, said sensor connected to generate a signal when said beam is interrupted.

21. Apparatus for delivering substrates to a substrate processing system through a load port thereof, as described in claim 14, wherein the enclosure is a substrate cassette adapted for engagement with said load module.

22. Apparatus for delivering substrates to a substrate processing system through a load port thereof, as described in claim 20, further comprising a microprocessor operatively associated with a control system for said substrate processing system, said microprocessor connected to receive the signal from said sensor and process said signal for use in delivering, said substrates to said processing system.

23. Apparatus for delivering substrates to a substrate processing system through a load port thereof, as described in claim 22 wherein said microprocessor monitors the position of the probe on said travel rail and correlates the receipt of an interrupt signal to said position on said travel rail to establish a substrate location, and further wherein said substrate location is stored for use in said substrate processing system.

24. A method of mapping the location of substrates in a substrate loading enclosure, said enclosure constructed to present substrates to a substrate processing system, to enable delivery of said substrates from said enclosure to a load port of a loading module which is part of said substrate processing system, said method comprising the steps of:

positioning an enclosure, having a stack of slots for retaining substrates, in relation to a load port opening of said load port for delivery of said substrates;

constructing a mapping mechanism having a probe supported on an elongated lever arm and a sensing plane extending transverse to a longitudinal axis of said lever arm, said probe further having a through beam sensor mounted in said sensing plane to generate a signal when said beam is interrupted;

mounting said mapping mechanism adjacent said load port to map the slots of said enclosure, the mapping mechanism is arranged relative to the load port opening so that the elongated arm extends longitudinally across an edge of the load port opening;

moving said mapping mechanism in a linear manner independently of movement of a load port door or a loading robot to traverse said stack of slots;

rotating said probe about said longitudinal axis of said lever arm from a stored position to a sensing position, wherein, in said stored position said sensing plane is parallel to said load port and in said sensing position said sensing plane is rotated to be parallel with a plane of said substrate slots, wherein a substrate will interrupt said beam during said linear movement of said mapping mechanism.

25. A method of mapping the location of substrates in a substrate loading enclosure, said enclosure constructed to present substrates to a substrate processing system, to enable delivery of said substrates from said enclosure to a load port of a loading module which is part of said substrate processing system, according to claim 24, wherein said step of moving the mapping mechanism in a linear manner is accomplished by mounting the mapping mechanism on a travel rail.

26. A method of mapping the location of substrates in a substrate loading enclosure, said enclosure constructed to present substrates to a substrate processing system, to enable delivery of said substrates from said enclosure to a load port of a loading module which is part of said substrate processing system, according to claim 24, wherein said step of rotating said mapping mechanism is accomplished through engagement of a cam and follower during said linear movement.

27. A method of mapping the location of substrates in a substrate loading enclosure, said enclosure constructed to present substrates to a substrate processing system, to enable delivery of said substrates from said enclosure to a load port of a loading module which is part of said substrate processing system, according to claim 24, wherein the load port is defined by a border and said mapping mechanism is mounted on said border.

28. A method of mapping the location of substrates in a substrate loading enclosure, said enclosure constructed to present substrates to a substrate processing system, to enable delivery of said substrates from said enclosure to a load port of a loading module which is part of said substrate processing system, according to claim 24, wherein said mapping mechanism is mounted inside said load module and said mapping mechanism is attached in a position in which said sensing plane extends through said load port into said enclosure in the sensing position.

29. A method of mapping the location of substrates in a substrate loading enclosure, said enclosure constructed to present substrates to a substrate processing system, to enable delivery of said substrates from said enclosure to a load port of a loading module which is part of said substrate processing system, according to claim 24, further comprising the step of monitoring the position of the probe on a travel rail and correlating the receipt of a sensor signal to said position on said travel rail to establish a substrate location, and further wherein said substrate location is stored for use in said substrate processing system.

* * * * *